United States Patent
Gans

(10) Patent No.: US 9,935,632 B1
(45) Date of Patent: Apr. 3, 2018

(54) METHODS AND SYSTEMS FOR AVERAGING IMPEDANCE CALIBRATION

(71) Applicant: MICRON TECHNOLOGY, INC., Boise, ID (US)

(72) Inventor: Dean D. Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/654,499

(22) Filed: Jul. 19, 2017

(51) Int. Cl.
| | | |
|---|---|---|
| *H03K 19/00* | (2006.01) |
| *G11C 11/4093* | (2006.01) |
| *H03K 19/0175* | (2006.01) |
| *G11C 11/4094* | (2006.01) |
| *G11C 29/02* | (2006.01) |
| *H03K 19/003* | (2006.01) |

(52) U.S. Cl.
CPC ...... *H03K 19/0005* (2013.01); *G11C 11/4093* (2013.01); *G11C 11/4094* (2013.01); *G11C 29/022* (2013.01); *H03K 19/003* (2013.01); *H03K 19/017545* (2013.01)

(58) Field of Classification Search
CPC ............. H03K 19/0005; H03K 19/003; H03K 19/00315; H03K 19/0175; H03K 19/017545; G11C 11/4093–11/4094; H03H 11/28; H03H 11/30
See application file for complete search history.

(56) References Cited

U.S. PATENT DOCUMENTS

| | | | | |
|---|---|---|---|---|
| 6,541,996 B1* | 4/2003 | Rosefield | ........... | H03K 19/0005 326/26 |
| 2004/0021481 A1* | 2/2004 | Ohno | ................. | H03K 19/0005 326/30 |
| 2008/0054935 A1* | 3/2008 | Pan | ..................... | H03K 19/0005 326/30 |
| 2008/0068040 A1* | 3/2008 | Morishima | ........ | H03K 19/0005 326/30 |
| 2008/0094112 A1* | 4/2008 | Tanaka | ................. | H03K 17/164 327/108 |
| 2009/0256586 A1* | 10/2009 | Oguri | ................. | H03K 19/0005 326/30 |
| 2011/0066798 A1* | 3/2011 | Kaiwa | ...................... | G11C 7/04 711/106 |
| 2012/0256654 A1* | 10/2012 | Cho | ................. | H03K 19/01754 326/30 |
| 2013/0088257 A1* | 4/2013 | Hara | ................ | H03K 19/00315 326/30 |
| 2015/0340069 A1 | 11/2015 | Arai et al. | | |

* cited by examiner

*Primary Examiner* — Jason M Crawford
(74) *Attorney, Agent, or Firm* — Fletcher Yoder, P.C.

(57) ABSTRACT

A semiconductor device includes a power management integrated circuit that supplies a periodic supply voltage signal. The semiconductor device also includes programmable termination components and a calibration circuit. The calibration circuit generates impedance calibration codes associated with a period of the periodic supply voltage signal. The calibration circuit also calibrates impedance of the programmable termination components based on an average impedance calibration code of the impedance calibration codes. The semiconductor device further includes an averaging circuit that determines the average impedance calibration code of the impedance calibration codes.

30 Claims, 10 Drawing Sheets

METHODS AND SYSTEMS FOR AVERAGING IMPEDANCE CALIBRATION

BACKGROUND

Field of the Present Disclosure

Embodiments of the present disclosure relate generally to the field of semiconductor devices. More specifically, embodiments of the present disclosure relate to calibrating impedance of a semiconductor device.

Description of Related Art

A semiconductor device, such as a microcomputer, memory, gate array, among others, may include input/output pins and an output circuit for transmitting data to other devices, via a bus, transmission lines formed on a board, and the like. The semiconductor device may include a circuit that controls transmitting the data and may include, for example, output buffers and drivers. To consistently and accurately transmit data, an impedance of the semiconductor device may be matched to an impedance of a transmission network and/or a receiving device.

A semiconductor device, such as a low power dynamic random access memory (LPDRAM) devices (and other similar semiconductor devices), may use a ZQ calibration process to tune certain components of the semiconductor device, such as a dynamic random access memory (DRAM), input/output drivers, and/or on-die termination components, across changes in process, voltage, and/or temperature. In particular, the ZQ calibration process may use a periodic (as commanded by a memory controller) calibration to compare the components with reference values to maintain consistent impedance across process, voltage, and/or temperature. However, the ZQ calibration process may lose accuracy if voltage conditions are not consistent.

For example, a PMIC (power management integrated circuit) may supply a voltage to and/or manage power in the semiconductor device. The supply voltage may include a period and frequency, and also include a DC (direct current) ripple or variation that may distort calibration by as much as a full DC amplitude of the source voltage. The frequency of the supply voltage may be much higher than a frequency of the calibration, while the period of the supply voltage may be longer than is practical for a single calibration event to average.

Accordingly, embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, multiple impedance calibrations may be performed over a period of time (e.g., over a calibration period) as a power supplied by a PMIC (power management integrated circuit) exhibits a DC (direct current) ripple or variation. The multiple impedance calibrations may be averaged to generate a subsequent impedance calibration that may reduce and/or mitigate calibration error due to the DC ripple.

Figure 1:
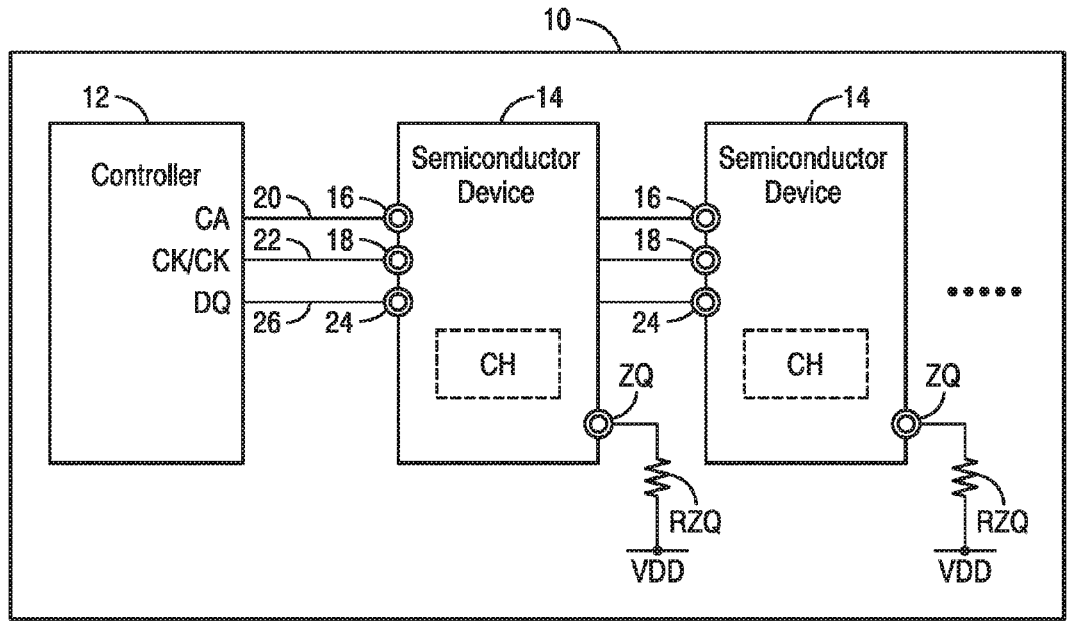
FIG. 1 is a block diagram of a system that includes semiconductor devices and a controller, according to an embodiment of the present disclosure.

FIG. 1 is a block diagram of a system 10 that includes a controller 12 communicatively coupled to semiconductor devices 14, according to an embodiment of the present disclosure. The controller 12 may control the semiconductor devices 14. In some embodiments, the semiconductor devices 14 may include a DDR5 (Double Data Rate 5) SDRAM (synchronous dynamic random access memory) integrated on a semiconductor chip, a LPDDR4 (Low Power Double Data Rate 4) type DRAM (dynamic random access memory) integrated on a single semiconductor chip, and the like. Each of the semiconductor devices 14 is provided with a channel CH coupled to an external terminal. The channel CH may facilitate read and/or write operations based on a command/address signal CA and/or external clock signals CK and/CK supplied from a core portion of the controller 12.

The command/address signal CA and the external clock signals CK and/CK may be supplied to command/address terminals 16 and clock terminals 18 of the semiconductor devices 14 via a command/address bus 20 and a clock bus 22, respectively. The command/address signal CA and the external clock signals CK and/CK are supplied to the channel CH, thereby facilitating access operations with respect to memory cell arrays contained in the channel CH. However, some signals transmitted using the command/address signal CA, such as chip select signals, may be individually supplied to one, two, or more of the semiconductor devices 14.

Read data DQ may be read from the channel CH of the semiconductor devices 14 and output via data terminals 24 to the controller 12 via a data bus 26. Conversely, write data DQ may be written to the channel CH from the controller 12 via the data bus 26. In some embodiments, the semiconductor devices 14 may not allow write operations, but instead only allow read operations, such as in the case of a ROM (read only memory)-based semiconductor device.

The semiconductor devices 14 may include calibration terminals ZQ. Each calibration terminal ZQ may couple to a respective channel CH of each semiconductor device 14. Each calibration terminal ZQ may also be coupled to a respective power-source potential VDD via a reference resistor RZQ provided on, for example, a memory module substrate or a motherboard. The reference resistor RZQ may have a resistance value referred to as "RZQ" in some cases. Other elements and/or circuits may also have the resistance value referred to as "RZQ," indicating that the elements and/or circuits have the same resistance values as the resistance value of the reference resistor RZQ.

In some embodiments, each semiconductor device 14 may have multiple channels, including the channel CH. In such embodiments, the controller 12 and/or semiconductor devices 14 may each include terminals and/or signals corresponding to the additional channels.

Figure 2:
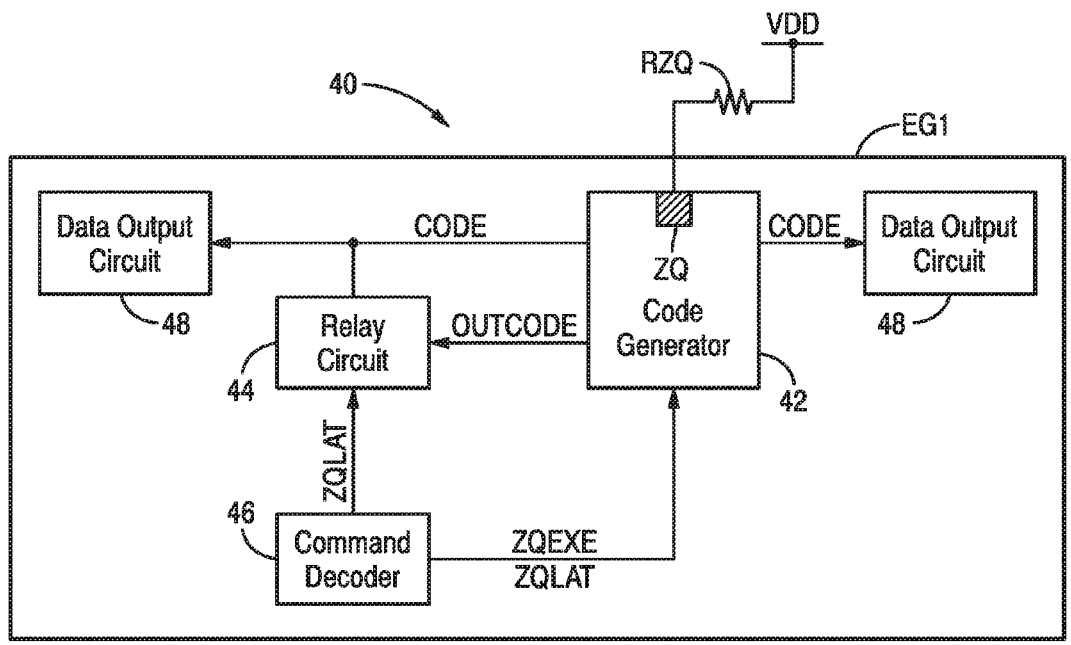
FIG. 2 is a schematic diagram of a system for calibrating impedance disposed in a channel of a semiconductor device of FIG. 1, according to an embodiment of the present disclosure.

FIG. 2 is a schematic diagram of a system 40 for calibrating impedance in a channel CH of a semiconductor device 14 of FIG. 1, according to an embodiment of the present disclosure. The system 40 includes a code generator 42 and a relay circuit 44. The code generator 42 may include a circuit that generates an adjustment code OUTCODE based on a voltage of the calibration terminal ZQ, a calibration execution signal ZQEXE supplied from a command decoder 46, and a code update signal ZQLAT supplied from the command decoder 46. The code generator 42 may generate and transmit the adjustment code OUTCODE to the relay circuit 44. The relay circuit 44 may then generate and send an adjustment code CODE based on the adjustment code OUTCODE to data output circuits 48, thereby adjusting output impedance of the data output circuits 48.

The relay circuit 44 may transmit the adjustment code OUTCODE from the code generator 42 as the adjustment code CODE instead of directly supplying the adjustment code OUTCODE to the data output circuits 48 because the distance between the code generator 42 and the data output circuit 48 is long. If the code generator 42 and the data output circuit 48 are directly connected to each other, every time the value of the adjustment code OUTCODE is changed during a calibration operation, the long-distance line is charged/discharged, and consumed current may increase. To prevent this, the code generator 42 may transmit the adjustment code OUTCODE from to the relay circuit 44 after the calibration operation is complete to adjust the output impedance of the data output circuits 48 based on the adjustment code CODE stored in the relay circuit 44.

Figure 3:
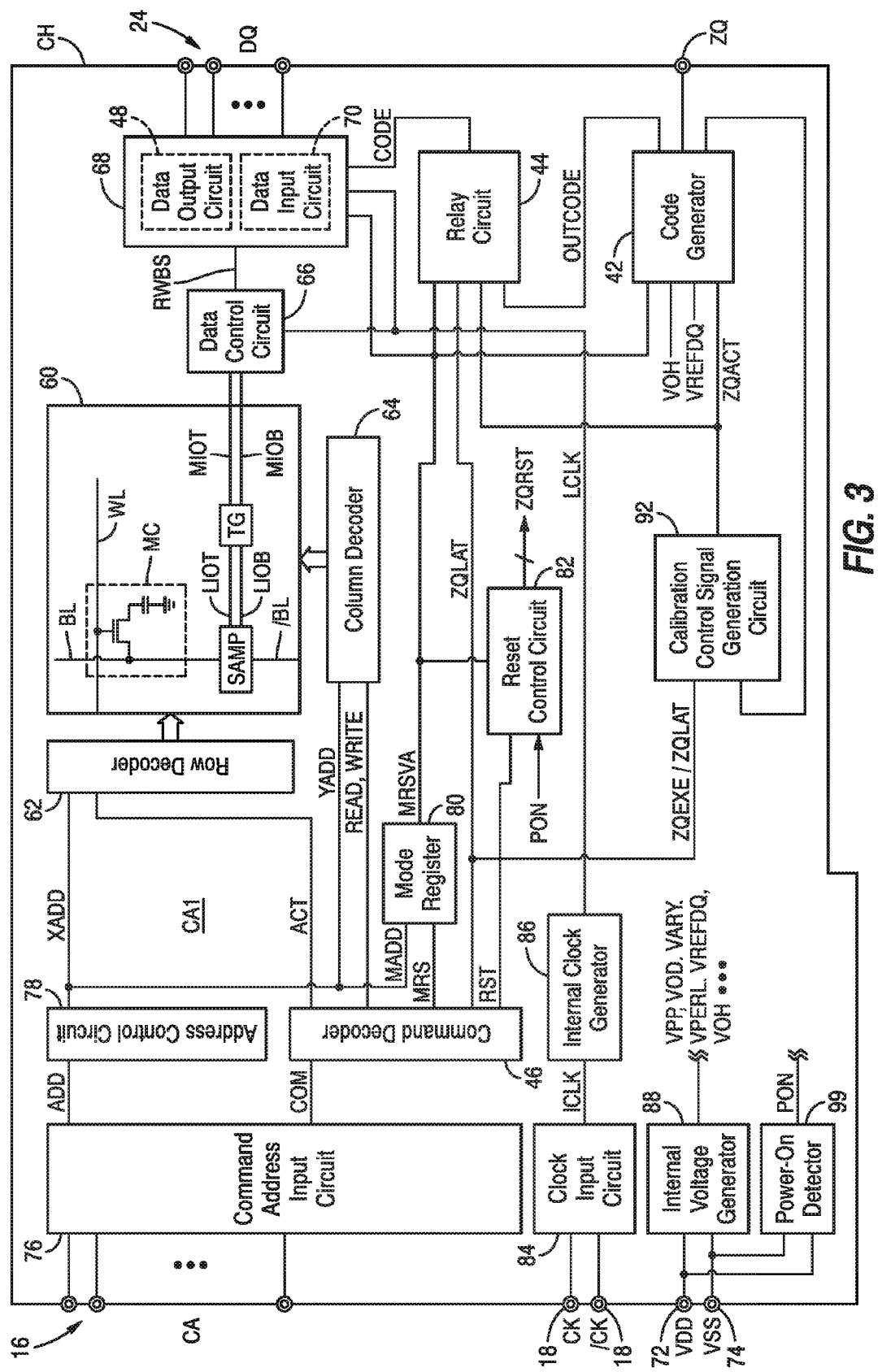
FIG. 3 is a schematic diagram of a channel of a semiconductor device of FIG. 1, according to an embodiment of the present disclosure.

FIG. 3 is a schematic diagram of a channel CH of a semiconductor device 14 of FIG. 1, according to an embodiment of the present disclosure. The channel CH may include a memory cell array 60, which may include word lines WL and bit lines BL and/BL, with memory cells MC disposed at intersections of the word lines WL and bit lines BL and/BL. A row decoder 62 may select word lines WL, while a column decoder 64 may select bit lines BL and/BL. The bit lines BL and/BL may be paired and coupled to a sense amplifier SAMP of the memory cell array 60. The sense amplifier SAMP may amplify a voltage difference generated between the bit lines BL and/BL. The sense amplifier SAMP may also supply read data based on the voltage difference generated between the bit lines BL and/BL to complementary local input/output lines LIOT/LIOB. The read data supplied to the local input/output lines LIOT/LIOB may be transferred to complementary main input/output lines MIOT/MIOB via a switch circuit TG. The read data on the main input/output lines MIOT/MIOB may then be converted to single-ended signals by a data control circuit 66 and transmitted to a data input/output circuit 68 via a read/write bus RWBS. The data input/output circuit 68 may include the data output circuit 48 and a data input circuit 70.

The channel CH may include the command/address terminals 16, the clock terminals 18, the data terminals 24, voltage terminals 72 and 74, and the calibration terminal ZQ. The command/address signals CA may be received via the command/address terminals 16 and sent to a command/address input circuit 76. The command/address signals CA may include address signals ADD and command signals COM. The address signals ADD may be sent to an address control circuit 78, while the command signals COM may be sent to the command decoder 46. The command/address input circuit 76, the address control circuit 78, the command decoder 46, the row decoder 62, and the column decoder 64, which may access the memory cell array 60, may constitute a first command/address control circuit CA1.

The address control circuit 78 may supply row addresses XADD to the row decoder 62 and column addresses YADD to the column decoder 64 based on the address signals ADD. The address control circuit 78 may also supply a mode signal MADD to a mode register 80 if there is an entry in a mode register set MRS. The mode register 80 may include a circuit that sets a parameter representing an operation mode of the channel CH. The mode register 80 may output mode signals including an output-level select signal MRSVA. The output-level select signal MRSVA may be supplied to the data input/output circuit 68. The output-level select signal MRSVA may include a signal for selecting the output level of the read data DQ.

The command decoder 46 may include a circuit that generates internal commands by decoding the command signals COM. For example, the command decoder 46 may generate active signals ACT, read signals READ, write signals WRITE, mode-register-set signals MRS, the calibration execution signals ZQEXE, the code update signals ZQLAT, reset signals RST, and the like.

The active signal ACT may include a signal that is transmitted if the command signal COM indicates accessing a row (e.g, an active command). For the purposes of the present disclosure, a signal may be transmitted or sent when the signal is driven to a high level. When the active signal ACT is transmitted, the row address XADD latched in the address control circuit 78 may be supplied to the row decoder 62. The word line WL specified by the row address XADD may then be selected.

The read signal READ and the write signal WRITE may include signals that are transmitted if the command signals COM indicate a read command and a write command. When the read signal READ or the write signal WRITE is transmitted, the column address YADD latched in the address control circuit 78 may be supplied to the column decoder 64. The bit line BL or/BL specified by the column address YADD may then be selected.

Therefore, if an active command and a read command are both transmitted, and the row address XADD and the column address YADD are input synchronously with the active command and the read command, then the read data DQ may be read from the memory cell MC specified by the row address XADD and the column address YADD. The read data DQ may be output from the data terminal 24 via the data control circuit 66 and the data output circuit 48 (e.g., disposed in the data input/output circuit 68). If an active command and a write command are both transmitted, and the row address XADD and the column address YADD are input synchronously with the active command and the write command, then the write data DQ may be input to the data terminal 24. Thus, the write data DQ may be supplied to the memory cell array 60 via the data input circuit 70 (e.g., disposed in the data input/output circuit 68) and the data control circuit 66, and written to the memory cell MC, which may be specified by the row address XADD and the column address YADD.

The mode-register-set signal MRS may include a signal that is transmitted if the command signal COM indicates a mode-register-set command. If the mode-register-set command is indicated and the mode signal MADD is input from the command/address terminal 16 synchronously with the mode-register-set command, then a set value of the mode register 80 may be rewritten.

The calibration execution signal ZQEXE may include a signal that is transmitted if the command signal COM indicates a calibration command. When the calibration execution signal ZQEXE is transmitted, the code generator 42 may execute a calibration operation, thereby generating the adjustment code OUTCODE. The adjustment code OUTCODE may be transmitted to the relay circuit 44 after the calibration operation is complete.

The code update signal ZQLAT may include a signal that is transmitted if the command signal COM indicates a code update command. When the code update signal ZQLAT is transmitted, an adjustment code CODE stored by the relay circuit 44 may be supplied to the data input/output circuit 68. The output impedance of the data output circuit 48 may then be adjusted based on the adjustment code CODE.

The reset signal RST may include a signal that is transmitted if the command signal COM indicates a reset command. The reset signal RST may be input to a reset control circuit 82. Based on various reset requests in the semiconductor device 14, the reset control circuit 82 controls states of corresponding circuit blocks. For example, a reset request may include power-on reset signals PON, in addition to the above described reset signal RST. The output-level select signal MRSVA may also be input to the reset control circuit 82.

The external clock signals CK and/CK may be input to the clock terminals 18. The external clock signal CK and the external clock signal/CK may be mutually complementary signals, and both may be supplied to a clock input circuit 84. The clock input circuit 84 may receive the external clock signals CK and/CK and generate an internal clock signal ICLKA. The internal clock signal ICLKA may be used as a timing signal that defines operation timing of circuit blocks of the channel CH, such as the address control circuit 78 and the command decoder 46. The internal clock signal ICLK may also be supplied to an internal clock generator 86, which may generate a phase-controlled internal clock signal LCLK based on the internal clock signal ICLK. In some embodiments, the internal clock generator 86 may include a DLL (delay locked loop) circuit. The phase-controlled internal clock signal LCLK may be supplied to the data input/output circuit 68 and used as a timing signal for determining output timing of the read data DQ.

The voltage terminals 72 and 74 may receive power-source potentials VDD and VSS. The power-source potentials VDD and VSS may be supplied to an internal voltage generator 88. The internal voltage generator 88 generates various internal potentials VPP, VOD, VARY, and VPERI and reference potentials VREFDQ and VOH based on the power-source potentials VDD and VSS. The internal potential VPP may be used in the row decoder 62, the internal potentials VOD and VARY may be used in the sense amplifier SAMP, and the internal potential VPERI may be used in other circuit blocks. The reference potentials VREFDQ and VOH may be used in the code generator 42.

The voltage terminals 72 and 74 may also be coupled to a power-on detector 90. The power-on detector 90 may include a circuit that determines whether electrical current is flowing at the voltage terminals 72 and 74. If electrical current is determined to be flowing at the voltage terminals 72 and 74, the power-on reset signal PON may be transmitted. The power-on reset signal PON may be supplied to circuit blocks of the channel CH and the circuit blocks may be reset.

The calibration terminal ZQ may be coupled to the code generator 42. When a calibration activation or control signal ZQACT is received, the code generator 42 may reference an impedance of the reference resistor RZQ and the reference potentials VREFDQ and VOH, and perform a calibration operation. The adjustment code OUTCODE may be generated and supplied to the relay circuit 44, which may generate and supply the adjustment code CODE based on the adjustment code OUTCODE to the data input/output circuit 68. The output impedance of the data output circuit 48 may then be adjusted based on the adjustment code OUTCODE. When the calibration operation is completed, the code generator 42 may output a calibration end signal CALEND.

A calibration control signal generation circuit 92 may generate the calibration control signal ZQACT. The calibration control signal generation circuit 92 may send the calibration control signal ZQACT in response to receiving the calibration execution signal ZQLAT or ZQEXE supplied from the command decoder 46. The calibration control signal generation circuit 92 may also not send the calibration control signal ZQACT in response to receiving the calibration end signal CALEND from the code generator 42. For the purposes of the present disclosure, a signal may not be transmitted or sent when the signal is driven to a low level. The calibration control signal generation circuit 92 may include timing circuitry, such as a timer, that enables transmitting one or more calibration control signals ZQACT (e.g., periodically and/or at predetermined intervals) based on receiving the calibration execution signal ZQLAT or ZQEXE. For example, the calibration control signal generation circuit 92 may receive the calibration execution signal ZQEXE, a n number of calibrations to perform, and a period of the calibrations, and transmit n calibration control signals ZQACT, each separated by the period.

Figure 4:
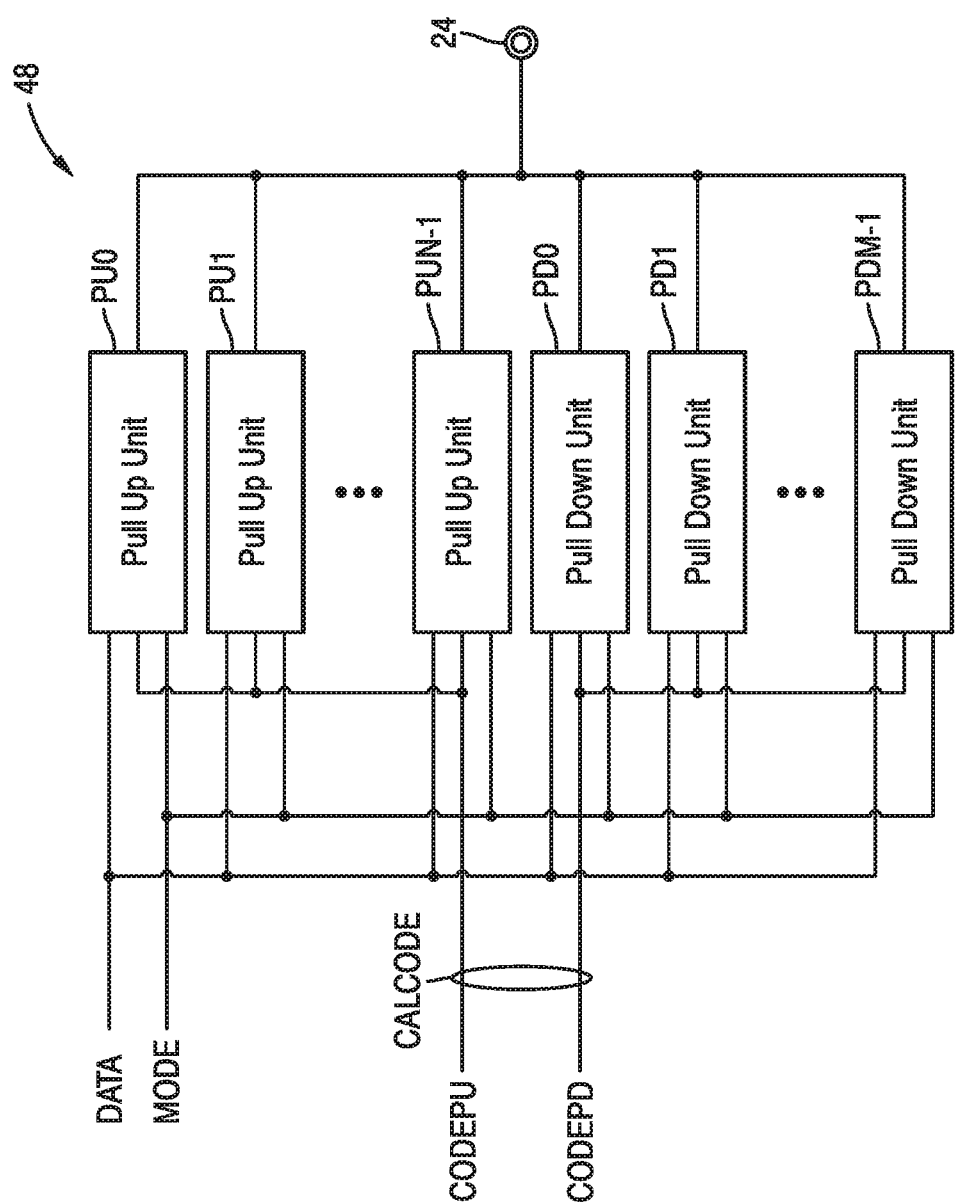
FIG. 4 is a schematic diagram of a data output circuit of the channel of FIG. 3, according to an embodiment of the present disclosure.

FIG. 4 is a schematic diagram of the data output circuit 48 of the channel CH of FIG. 3, according to an embodiment of the present disclosure. The data output circuit 48 may include N pull up units PU0 to PUN−1 and M pull down units PD0 to PDM−1. Any suitable number N of pull up units may be included in the data output circuit 48, such as between two and one hundred (e.g., seven) pull up units. Similarly, any suitable number M of pull down units may be included in the data output circuit 48, such as between two and one hundred (e.g., seven) pull down units. Output nodes of the pull up units PU0 to PUN−1 and the pull down units PD0 to PDM−1 may be commonly coupled to the data terminal 24. The pull up units PU0 to PUN−1 may include mutually same circuit configurations and may be collectively referred to as "pull up units PU." Similarly, the pull down units PD0 to PDM−1 may include mutually same circuit configurations and may be collectively referred to as "pull down units PD."

Each pull up unit PU (PU0 to PUN−1) may form a pair with a corresponding pull down unit PD (PD0 to PDM−1). The number of the units may be specified by an impedance select signal MODE output from the mode register 80. Internal data DATA may be supplied from the data control circuit 66 to the pull up units PU0 to PUN−1 and the pull down units PD0 to PDM−1. If the internal data DATA is indicating a high level, one, two, or more pull up units specified by the impedance select signal MODE may be activated among the pull up units PU0 to PUN−1, and, as a result, the data terminal 24 may be driven to the high level. On the other hand, if the internal data DATA is indicating a low level, one, two, or more pull down units specified by the impedance select signal MODE may be activated among the pull down units PD0 to PDM−1, and, as a result, the data terminal 24 may be driven to the low level.

The impedance of each of the activated pull up units PU0 to PUN−1 may be specified by a pull up code CODEPU, which may be part of the adjustment code CODE. Similarly, the impedance of each of the activated pull down units PD0 to PDM−1 may be specified by a pull down code CODEPD, which may be part of the adjustment code CODE. For example, an impedance target value of the pull up units PU0 to PUN−1 may be 2RZQ, and an impedance target value of the pull down units PD0 to PDM−1 may be RZQ. In this example, if the units of j pairs are used according to the impedance select signal MODE, the impedance of high-level output may become 2RZQ/j, and the impedance in the case of low-level output may become RZQ/j.

Figure 5:
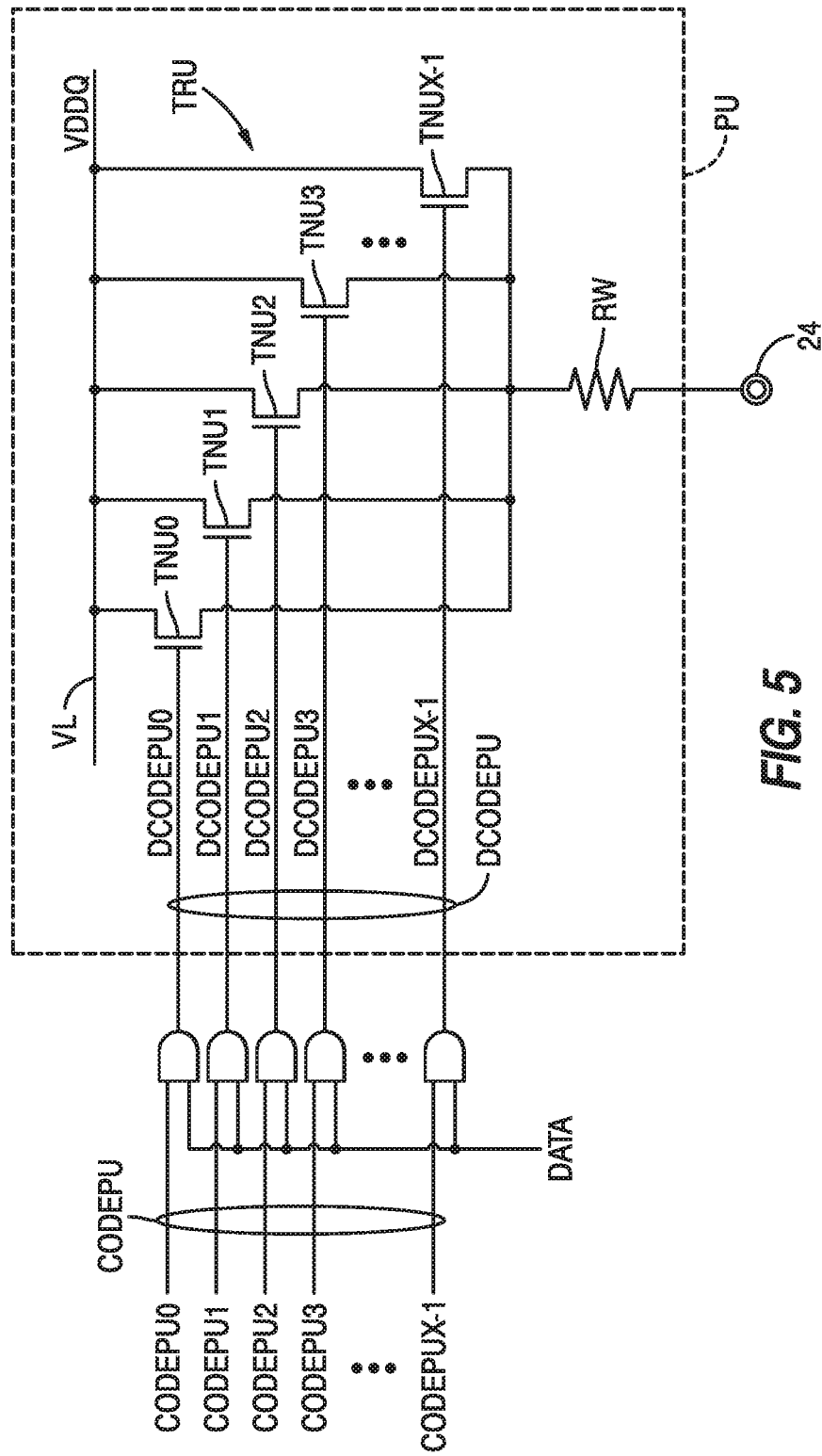
FIG. 5 is a schematic diagram of a pull up unit of the data output circuit of FIG. 4, according to an embodiment of the present disclosure.

FIG. 5 is a schematic diagram of the pull up unit PU of the data output circuit 48 of FIG. 4, according to an embodiment of the present disclosure. The pull up unit PU may include a transistor portion TRU, that includes XN-channel-type MOS transistors TNU0 to TNUX−1 coupled in parallel, and a high resistance line RW. Any suitable number X or type of transistors may be used, such as between one and one hundred (e.g., five) transistors. Drains of the transistors TNU0 to TNUX−1 may be commonly coupled to a voltage line VL, which may supply the power-source potential VDD. Sources of the transistors TNU0 to TNUX−1 may be coupled to the data terminal 24 via the high resistance line RW. The high resistance line RW may include, for example, a resistance of approximately 40Ω, as consistent with, for example, a tungsten line.

Code signal DCODEPU may include Xbits DCODEPU0 to DCODEPUX−1, which may be input to gate electrodes of the transistors TNU0 to TNUX−1, respectively. The code signal DCODEPU may include any suitable number X of bits may be contemplated, such that the number X of bits correspond to the number X of transistors, as shown. In some embodiments, the number of bits of the code signal DCODEPU may not correspond to the number of transistors. The X transistors TNU0 to TNUX−1 may be individually switched on or off based on the values of the bits of the code signal DCODEPU. The code signal DCODEPU may be generated based on sending bits of code signal CODEPU and internal data DATA to AND gate circuits. In additional or alternative embodiments, the code signal DCODEPU may be generated via any suitable logic. For example, if the internal data DATA indicates a low level, the bits DCODEPU0 to DCODEPU X−1 may be pulled down to low regardless of the values of the code signal CODEPU, and the transistors TNU0 to TNU X−1 may be turned off. If the internal data DATA indicates a high level, the values of the code signal CODEPU may be used as the values of the code control signals DCODEPU, and at least some of the transistors TNU0 to TNUX−1 may be turned on.

Figure 6:
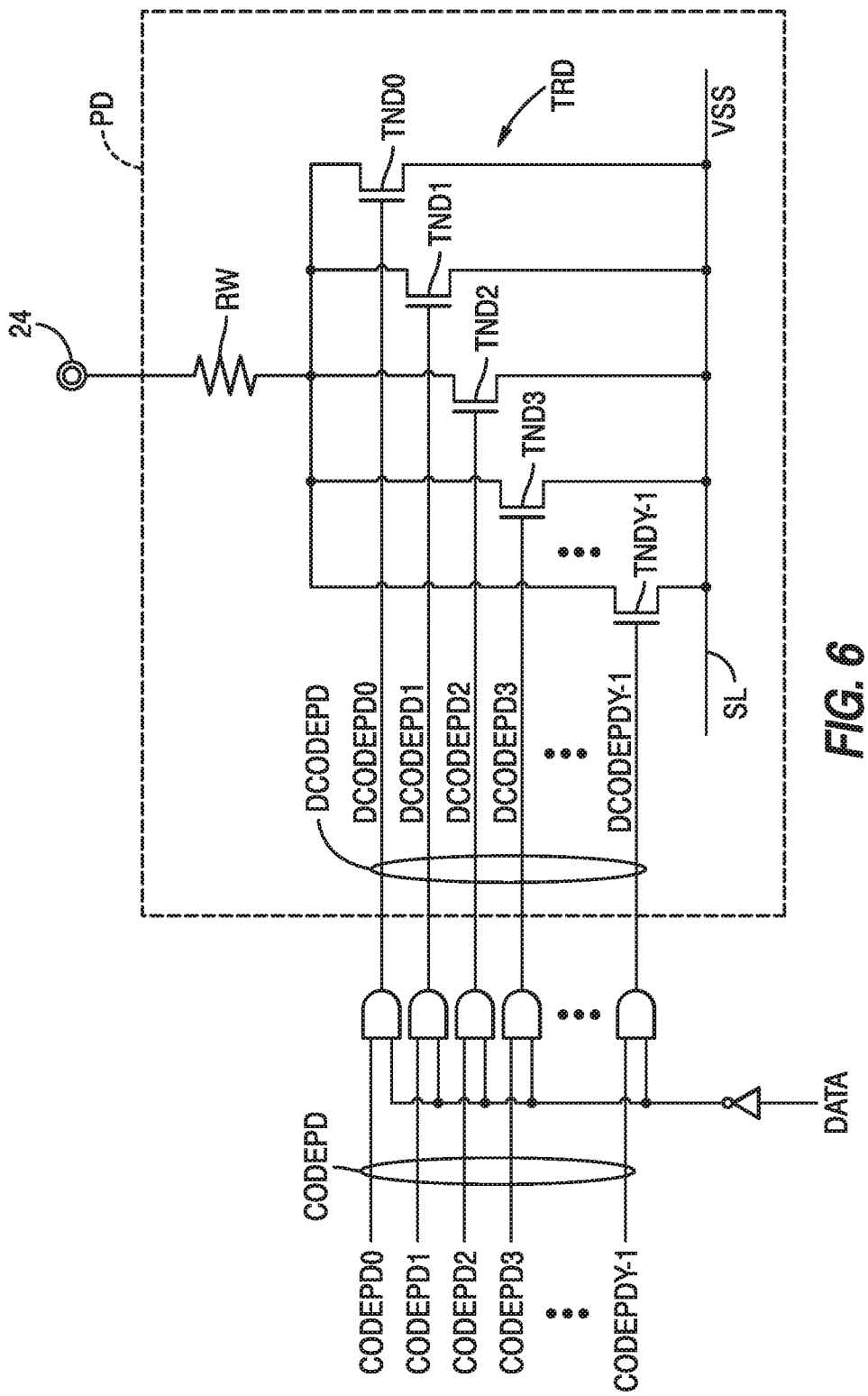
FIG. 6 is a schematic diagram of a pull down unit of the data output circuit of FIG. 4, according to an embodiment of the present disclosure.

FIG. 6 is a schematic diagram of the pull down unit PD of the data output circuit 48 of FIG. 4, according to an embodiment of the present disclosure. The pull down unit PD may include a transistor portion TRD, which may include Y N-channel-type MOS transistors TND0 to TNDY−1 coupled in parallel, and a high resistance line RW. Any suitable number Y or type of transistors may be used, such as between one and one hundred (e.g., five) transistors. Drains of the transistors TND0 to TND4 may be coupled to the data terminal 24 via the high resistance line RW. Sources of the transistors TND0 to TND4 may be commonly coupled to a voltage line SL, which may supply a ground potential VSSQ.

Code signal DCODEPD may include bits DCODEPD0 to DCODEPD4, which may be input to gate electrodes of the transistors TND0 to TNDY−1, respectively. The code signal DCODEPD may include any suitable number Y of bits may be contemplated, such that the number Y of bits correspond to the number Y of transistors, as shown. In some embodiments, the number of bits of the code signal DCODEPD may not correspond to the number of transistors. The Y transistors TND0 to TNDY−1 may be individually switched on or off based on the values of the code signals DCODEPD. The code signal DCODEPD may be generated based on sending bits of code signals CODEPD and an inverted signal of the internal data DATA to AND gate circuits. In additional or alternative embodiments, the code signal DCODEPD may be generated via any suitable logic. For example, if the internal data DATA indicates a high level, the bits DCODEPD0 to DCODEPD4 may be pulled down to low regardless of the values of the code signal CODEPD, and the transistors TND0 to TNDY−1 may be turned off. If the internal data DATA indicates a low level, the values of the code signals CODEPD may be used as the values of the code signal DCODEPD, and at least some of the transistors TND0 to TNDY−1 may be turned on.

In this manner, the impedance of each pull up unit PU and pull down unit PD may be adjusted based on the code signals CODEPU or CODEPD. The code signals CODEPU and CODEPD may be generated by calibration operations performed by the code generator 42 shown in FIGS. 2 and 3.

Figure 7:
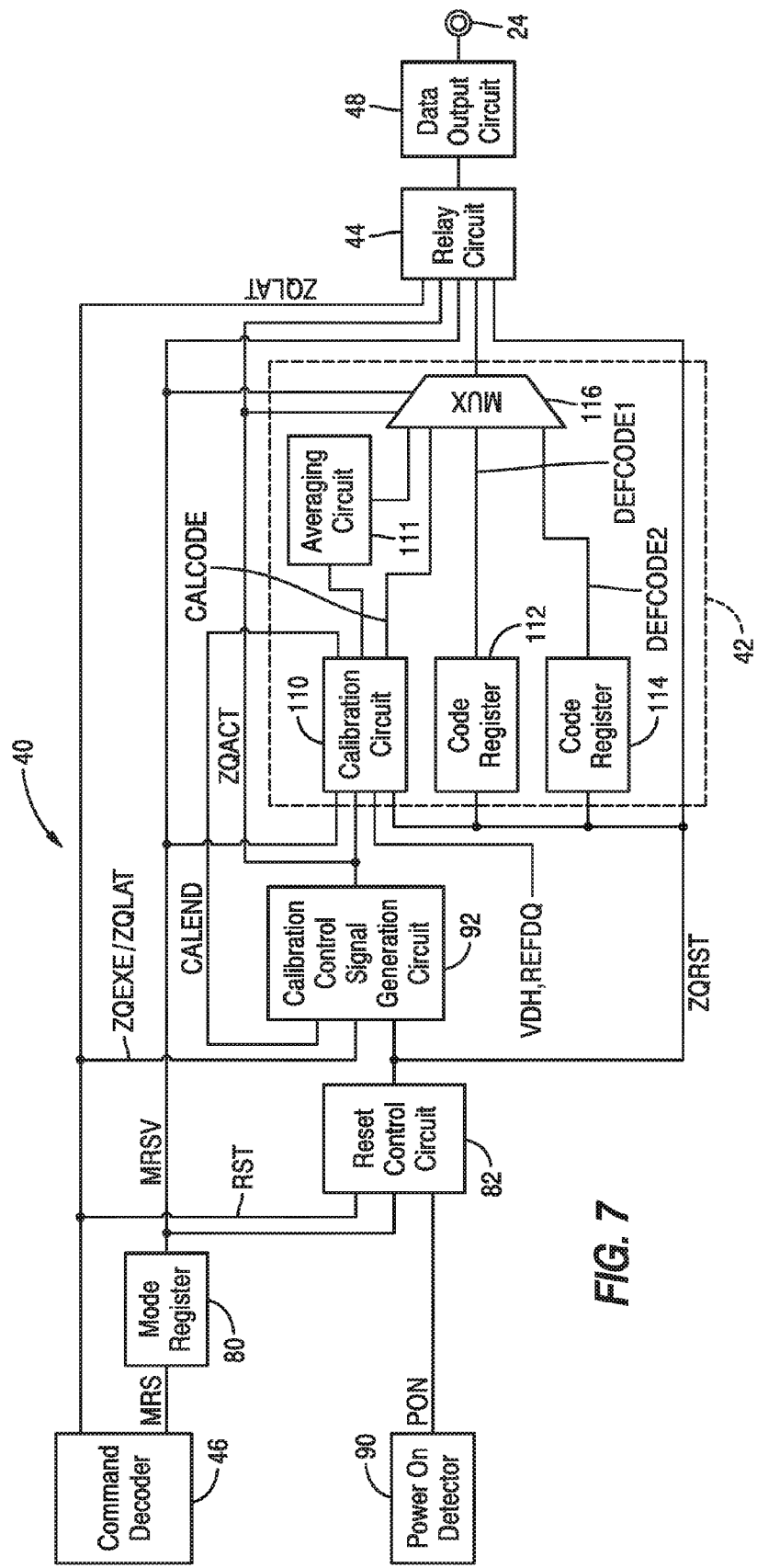
FIG. 7 is a schematic diagram of a more detailed view of the system for calibrating impedance of FIG. 2, according to an embodiment of the present disclosure.

FIG. 7 is a schematic diagram of a more detailed view of the system 40 for calibrating impedance of FIG. 2, according to an embodiment of the present disclosure. The code generator 42 may include a calibration circuit 110, an averaging circuit 111, code registers 112 and 114, and a multiplexer 116. The calibration circuit 110 may include a circuit which generates the adjustment code CALCODE by performing the calibration operation. The averaging circuit 111 may average the adjustment codes CALCODEs generated by the calibration circuit 110 to generate an averaged adjustment code. The averaging circuit 111 may include for example, a divider and/or any other suitable components. In some embodiments, to save die area, the averaging circuit 111 may average the adjustment codes CALCODEs as each of the adjustment codes CALCODEs is generated and/or received.

The code register 112 may include a register which sets an initial value of the adjustment code CALCODE to a default code DEFCODE1, e.g., when a first operation mode is selected. The code register 114 may include a register which sets an initial value of the adjustment code CALCODE to a default code DEFCODE2, e.g., when a second operation mode is selected. The calibration circuit 110 and the code registers 112 and 114 may output the adjustment codes CALCODE, DEFCODE1, and DEFCODE2 to multiplexer 116. Based on the calibration control signal ZQACT and the output-level select signal MRSVA, the multiplexer 116 may output one of the adjustment codes CALCODE, DEFCODE1, and DEFCODE2 to the relay circuit 44.

The reset control circuit 82 may supply reset signal group ZQRST to the code generator 42 and the relay circuit 44. The reset signal group ZQRST may indicate reset states corresponding to reset requests. The reset requests may be based on the reset signal RST, the power-on reset signal PON, switching of the output-level select signal MRSVA, and the like. Then, the reset control circuit 82 may transmit a predetermined reset signal as part of the reset signal group ZQRST based on the reset request. The reset signal group ZQRST may also be input to the calibration control signal generation circuit 92.

Figure 8:
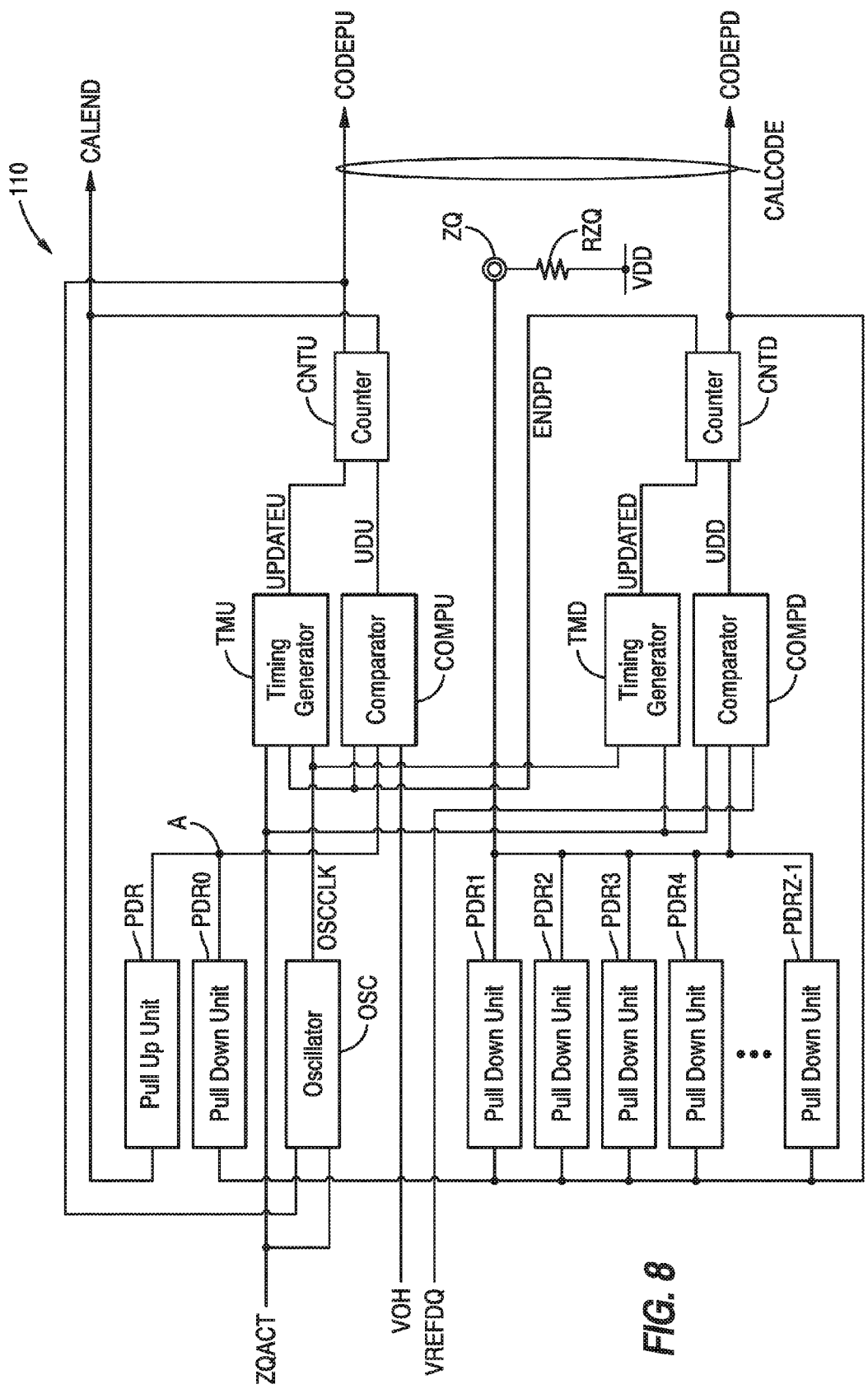
FIG. 8 is a schematic diagram of a calibration circuit, according to an embodiment of the present disclosure.

FIG. 8 is a schematic diagram of the calibration circuit 110 of FIG. 7, according to an embodiment of the present disclosure. The calibration circuit 110 may include a pull up unit PUR and pull down units PDR0 to PDRZ–1. Any suitable number Z of pull down units may be included in the calibration circuit 110 48, such as between two and one hundred (e.g., six) pull up units. The pull up unit PUR may have substantially the same circuit configuration as that of the pull up unit PU, and the impedance of the pull up unit PUR may be controlled by the code signal CODEPU. Similarly, the pull down units PDR0 to PDRZ–1 may have substantially the same circuit configurations as that of the pull down unit PD, and the impedance of the pull down unit PD may be controlled by the code signal CODEPD.

The output nodes of the pull down units PDR1 to PDRZ–1 may commonly couple to the calibration terminal ZQ and a comparator COMPD. In response to receiving the calibration control signal ZQACT, the comparator COMPD may compare a potential of the calibration terminal ZQ and the reference potential VREFDQ and, based on the result thereof, generate an up/down signal UDD. The comparator COMPD may send the up/down signal UDD to a counter CNTD, and, based on the up/down signal UDD, the counter CNTD may increment or decrement the code signal CODEPD (e.g., indicating a count value of the counter CNTD). The counter CNTD may increment or decrement the code signal CODEPD synchronously with receiving an update signal UPDATED. If a timing generator TMD receives the calibration control signal ZQACT, the timing generator TMD may generate the update signal UPDATED while synchronously receiving an oscillator signal OSCCLK. An oscillator OSC may generate the oscillator signal OSCCLK based on receiving the calibration control signal ZQACT. The oscillator OSC may not generate the oscillator signal OSCCLK if the calibration end signal CALEND is received.

The output nodes of the pull up unit PUR and the pull down unit PDR0 may be coupled to a connection node A. The connection node A may be coupled to a comparator COMPU. In response to receiving the calibration control signal ZQACT, the comparator COMPU may compare a potential of the connection node A and the reference potential VOH and, based on the result thereof, generate an up/down signal UDU. The comparator COMPU may supply the up/down signal UDU to a counter CNTU, and, based on the up/down signal UDU, the counter CNTU may increment or decrement the code signal CODEPU (e.g., a count value of the counter CNTU). The counter CNTU may increment or decrement the code signal CODEPU synchronously with receiving an update signal UPDATEU. If a timing generator TMU receives the calibration control signal ZQACT and a pull-down end signal ENDPD, the timing generator TMU generates the update signal UPDATEU synchronously with the oscillator signal OSCCLK.

The calibration circuit 110 performs a calibration operation in response to receiving the calibration control signal ZQACT. First, the pull down units PDR1 to PDRZ–1 may be calibrated. In response to receiving the calibration control signal ZQACT, the comparator COMPD may compare the potential of the calibration terminal ZQ to the reference potential VREFDQ. If the potential of the calibration terminal ZQ is lower than the reference potential VREFDQ, the counter CNTD may decrement the code signal CODEPD using the up/down signal UDD. As a result, the impedance of the pull down units PDR1 to PDRZ–1 may be increased, increasing the potential of the calibration terminal ZQ. Conversely, if the potential of the calibration terminal ZQ is higher than the reference potential VREFDQ, the counter CNTD may increment the code signal CODEPD using the up/down signal UDD. As a result, the impedance of the pull down units PDR1 to PDRZ–1 may be decreased, decreasing the potential of the calibration terminal ZQ.

After each calibration operation of the pull down units PDR1 to PDRZ–1 is performed (e.g., when receiving the update signal UPDATED), the potential of the calibration terminal ZQ approaches and/or approximately matches the reference potential VREFDQ. For example, if the reference potential VREFDQ is VDDQ/6, and the five pull down units PDR1 to PDRZ–1 are coupled in parallel to the calibration terminal ZQ, then when the potential of the calibration terminal ZQ approximately matches the reference potential VREFDQ, the resistance values of the pull down units PDR1 to PDRZ–1 approximately match the resistance value (RZQ) of the reference resistor RZQ. The impedance of the pull down unit PDR0 may also match RZQ.

When the calibration operation of the pull down units PDR1 to PDRZ–1 is complete, the counter CNTD may output the pull-down end signal ENDPD, and the calibration operation of the pull up unit PUR may begin. In response to receiving the pull-down end signal ENDPD, the comparator COMPU may compare the potential of the connection node A to the reference potential VOH. If the potential of the connection node A is higher than the reference potential VOH, the counter CNTU may decrement the code signal CODEPU using the up/down signal UDU. As a result, the impedance of the pull up unit PUR is increased, decreasing the potential of the connection node A. Conversely, if the potential of the connection node A is lower than the reference potential VOH, the counter CNTU increments the code signal CODEPU using the up/down signal UDU. As a result, the impedance of the pull up unit PUR is decreased, increasing the potential of the connection node A.

After each calibration operation of the pull up unit PUR is performed (e.g., when receiving the update signal UPDATEU), the potential of the connection node A approaches and/or approximately matches the reference potential VOH.

For example, if the reference potential VOH is VDDQ/3, and the impedance of the pull down unit PDR0 approximately matches RZQ, then when the potential of the connection node A approximately matches the reference potential VOH, the resistance value of the pull up unit PUR approximately matches two times the resistance value (2*RZQ) of the reference resistor RZQ.

When the calibration operation of the pull up unit PUR is complete, the counter CNTU may output the calibration end signal CALEND, and operation of the oscillator OSC may stop. The code signals CODEPU and CODEPD (adjustment codes CALCODE) generated by the calibration operations may then be supplied to the multiplexer 116 shown in FIG. 7.

Impedance calibration typically occurs periodically and in response to a command (e.g., via the command/address signal CA) provided (e.g., by the controller 12) to the semiconductor device 14 at, for example, power up, reset, a change of a frequency set point, or any other suitable time. In some embodiments, multiple impedance calibration operations may be performed (e.g., at a programmable interval) in response to the command. In alternative or additional embodiments, the impedance calibrations may be performed automatically by the semiconductor device 14 (e.g., as background operations). A PMIC (power management integrated circuit), such as the internal voltage generator 88, may supply a voltage to and/or manage power in the semiconductor device 14. The supply voltage may include a DC (direct current) ripple or variation that includes a period and frequency.

Figure 9:
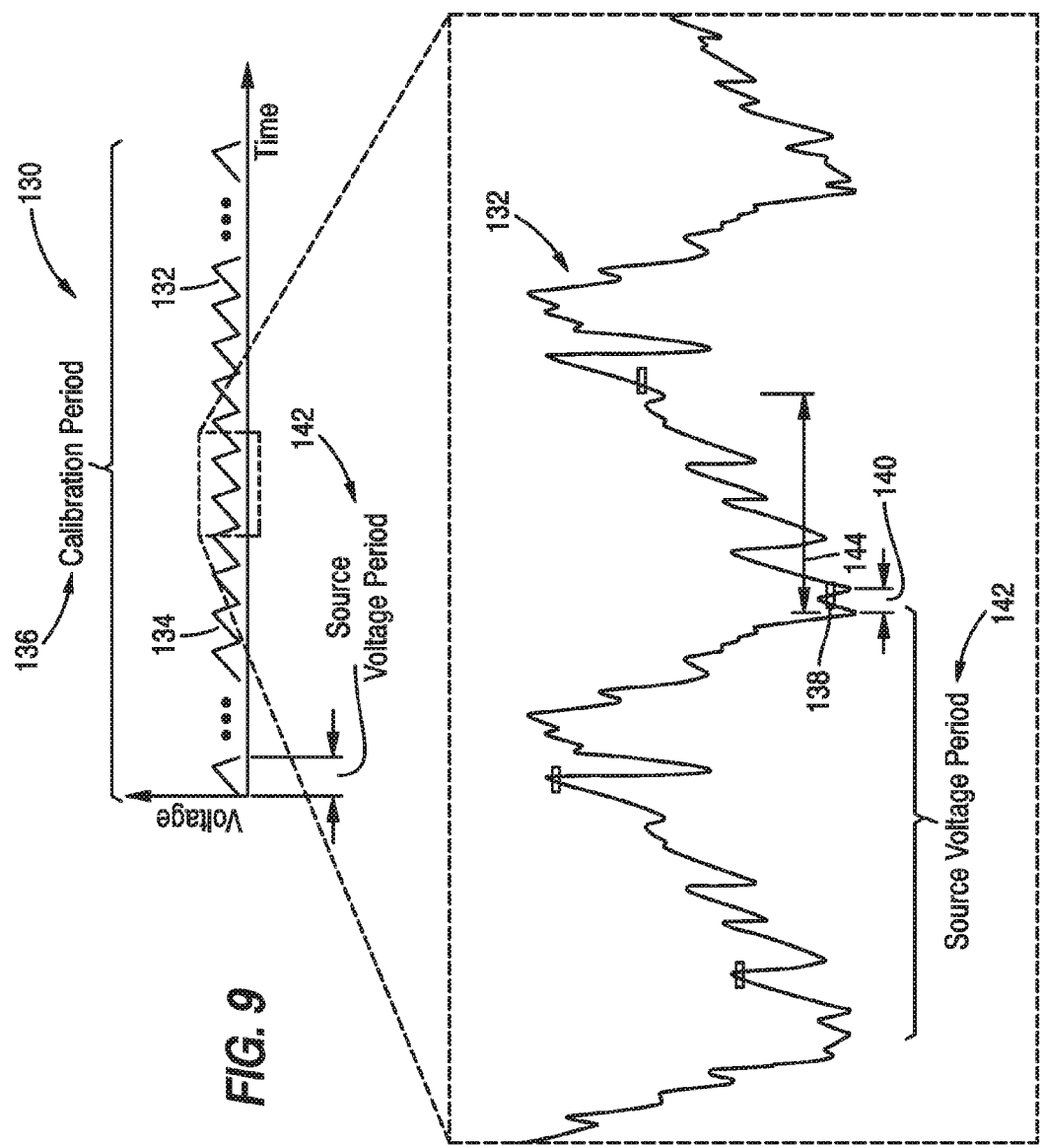
FIG. 9 is an example graph of a supply voltage that includes a DC (direct current) ripple and illustrates when impedance calibrations may be performed, according to an embodiment of the present disclosure.

FIG. 9 is an example graph 130 of a supply voltage 132 that includes the DC ripple 134 and illustrates when impedance calibrations may be performed, according to an embodiment of the present disclosure. The voltage range of the supply voltage 132 may be on the order of 10 mV (millivolts) to 100 mV (e.g., 30 mV to 50 mV, 40 mV, and the like). Typically, the controller 12 may send a calibration command with a frequency on the order of 6.67 Hz (hertz) to 33.33 Hz, yielding a period 136 of 30 to 150 ms (milliseconds). A calibration operation 138 typically may be completed in a period 140 of approximately 500 ns (nanoseconds). The supply voltage 132 may typically have a frequency on the order of 100 kHz to 500 kHz, yielding a period 142 of 2 us to 10 us. As such, the frequency of the supply voltage 132 may be much higher than a frequency of the calibration performed, while the period 142 of the supply voltage 132 may be longer than is practical for a single calibration 138 to average. If only a single calibration is performed in the calibration period 136, the calibration may become distorted and/or lose accuracy by as much as a full DC amplitude of the source voltage due to the DC ripple. Notably, the period 142 may vary somewhat for differing PMIC load conditions.

To compensate for the effects of the DC ripple of the source voltage 132 on impedance calibration, multiple calibrations 138 may be performed at a frequency several times that of the frequency of the supply voltage 132. That is, the multiple calibrations 138 may be performed several times (e.g., 2 to 20, 3 to 10, 4 to 8, and the like) at a period 144 that is a fraction of the period 142 of the supply voltage 132. In some embodiments, the number of calibrations 138 performed and/or the period 144 of the calibrations may be programmable. In certain of these embodiments, the number of calibrations 138 performed and/or the period 144 of the calibrations may be based on the frequency of the supply voltage 132. The multiple calibrations 138 may be averaged (e.g., via the averaging circuit 111), and then applied to calibrate the programmable termination components of the semiconductor device 14. In this manner, calibration error may be reduced (e.g., by approximately half).

For example, as illustrated in FIG. 9, four calibrations 138 are performed in approximately two periods 142 of the supply voltage 132. The period 142 of the supply voltage 132 may be approximately 10 us, while the period 144 of each calibration may include any suitable range of time, including 1 to 20 us (e.g., 5 us). The four calibrations 138 may be averaged, and then applied to calibrate the programmable termination components of the semiconductor device 14. While FIG. 9 illustrates the calibrations 138 performed in approximately two periods 142 of the supply voltage 132, it should be understood that any suitable number of calibrations 138 (e.g., two to 12 calibrations) may be performed in any suitable duration of the supply voltage 132 (e.g., between one and one hundred periods of the supply voltage 132).

Figure 10:
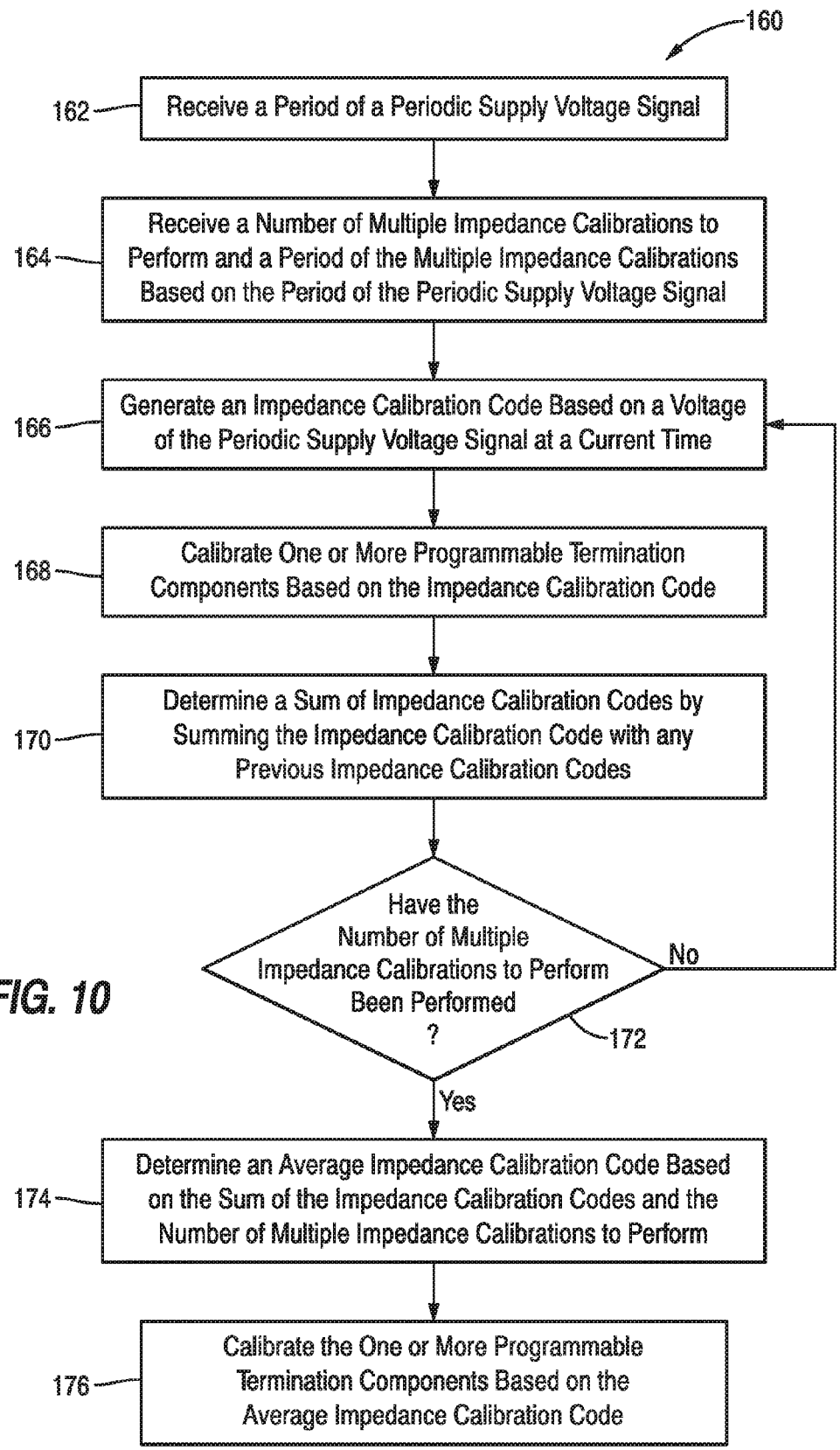
FIG. 10 is a flow diagram of a method for averaging multiple impedance calibrations to reduce calibration error caused by a DC (direct current) ripple in supply voltage, according to an embodiment of the present disclosure.

FIG. 10 is a flow diagram of a method 160 for averaging multiple impedance calibrations to reduce calibration error caused by a DC ripple in supply voltage, according to an embodiment of the present disclosure. The method 160 may be performed by any suitable device or combination of devices that may receive a period of the supply voltage, determine a period of multiple calibrations, instruct the calibration circuit 110 to perform the multiple calibrations using multiple calibration codes, instruct storage and/or summation of the multiple calibrations codes, and/or average the multiple calibration codes. While the method 160 is described using steps in a specific sequence, it should be understood that the present disclosure contemplates that the described steps may be performed in different sequences than the sequence illustrated, and certain described steps may be skipped or not performed altogether. Additionally, while certain components are described as performing the steps listed below, in additional or alternative embodiments, at least some of the steps of the method 160 may be performed by a controller (e.g., the controller 12) communicatively coupled to a semiconductor device (e.g., the memory device 14), and/or internally by components of the semiconductor device (e.g., the command address input circuit 76, the command decoder 46, the calibration control signal generation circuit 92, the code generator 42, the averaging circuit 111, and the like).

The calibration control signal generation circuit 92 receives (process block 162) a period of a periodic supply voltage signal. In some embodiments, the calibration control signal generation circuit 92 may receive the periodic supply voltage signal and then determine the period of the periodic supply voltage signal. The periodic supply voltage signal may be supplied by a PMIC, such as the internal voltage generator 88, or any other suitable power supply or voltage generator.

The calibration control signal generation circuit 92 then receives (process block 164) or determines a number of multiple impedance calibrations to perform and a period of the multiple impedance calibrations based on the period of the periodic supply voltage signal. In some embodiments, the calibration control signal generation circuit 92 may receive or determine a threshold number (e.g., between 2 and 20, between 3 and 10, between 4 and 8, and the like) of multiple impedance calibrations that may be performed in the period of the periodic supply voltage signal. In one embodiment, the calibration control signal generation circuit 92 may receive or determine the number of multiple impedance calibrations based at least in part on the time it takes to perform an impedance calibration (e.g., approximately 500 ns). For example, the calibration control signal generation circuit 92 may determine that if eight impedance calibrations may be performed in the period of the periodic supply voltage signal (based on the time it takes to perform the impedance calibration), then the number of multiple impedance calibrations to perform is eight, and the period of the multiple impedance calibrations is the period of the periodic supply voltage signal divided by eight. However, in some cases, the period of the periodic supply voltage signal may be such that only two impedance calibrations in the period, and as such, the number of multiple impedance calibrations to perform is two. In such cases, the period of the two impedance calibrations may be as low as the time it takes to perform the impedance calibration. In some embodiments, a controller, processor, processing system, and/or computing system external to the semiconductor device 14 may determine, estimate, or set the number of multiple impedance calibrations to perform and the period of the multiple impedance calibrations, which may then be used by the calibration control signal generation circuit 92 as the number of multiple impedance calibrations to perform and the period of the multiple impedance calibrations.

The calibration circuit 110 of the code generator 42 generates (process block 166) an impedance calibration code (e.g., the adjustment code CALCODE) based on a voltage of the periodic supply voltage signal at a current time. The calibration circuit 110 then calibrates (process block 168) one or more programmable termination components based on the impedance calibration code. In particular, the calibration circuit 110 may output the adjustment code CALCODE, which the relay circuit 44 may receive as the adjustment code OUTCODE. The relay circuit 44 may then generate and send an adjustment code CODE based on the adjustment code OUTCODE to data output circuits 48, thereby adjusting output impedance of the data output circuits 48.

The averaging circuit 111 determines (process block 170) a sum of impedance calibration codes by summing the impedance calibration code with any previous impedance calibration codes. The averaging circuit 111 may include an adder, registers, and/or any other suitable components. In some embodiments, the code generator 42 may include a summing circuit (e.g., having an adders, registers, and/or any other suitable components), separate from the averaging circuit 111, that may sum the impedance calibration code with any previous impedance calibration codes.

The calibration control signal generation circuit 92 or the calibration circuit 110 then determines (decision block 172) whether the number of multiple impedance calibrations to perform have been performed. If not, the process blocks 166, 168, 170, and decision block 672 are repeated.

If the calibration control signal generation circuit 92 or the calibration circuit 110 determines that the number of multiple impedance calibrations to perform have been performed, the averaging circuit 111 determines (process block 174) an average impedance calibration code based on the sum of the impedance calibration codes and the number of multiple impedance calibrations to perform. In particular, the averaging circuit 111 may divide the sum of the impedance calibration codes and the number of multiple impedance calibrations to perform. In some embodiments, to save die area, the averaging circuit 111 may average the impedance calibration codes as each of the impedance calibration codes is generated and/or received.

The calibration circuit 110 may then calibrate (process block 174) the one or more programmable termination components based on the average impedance calibration code. In particular, the calibration circuit 110 may output the adjustment code CALCODE based on the average impedance calibration code, which the relay circuit 44 may receive as the adjustment code OUTCODE. The relay circuit 44 may then generate and send an adjustment code CODE based on the adjustment code OUTCODE to data output circuits 48, thereby adjusting output impedance of the data output circuits 48. In this manner, calibration error that is a result of the DC ripples of the periodic supply voltage signal may be reduced (e.g., by approximately half).

Figure 11:
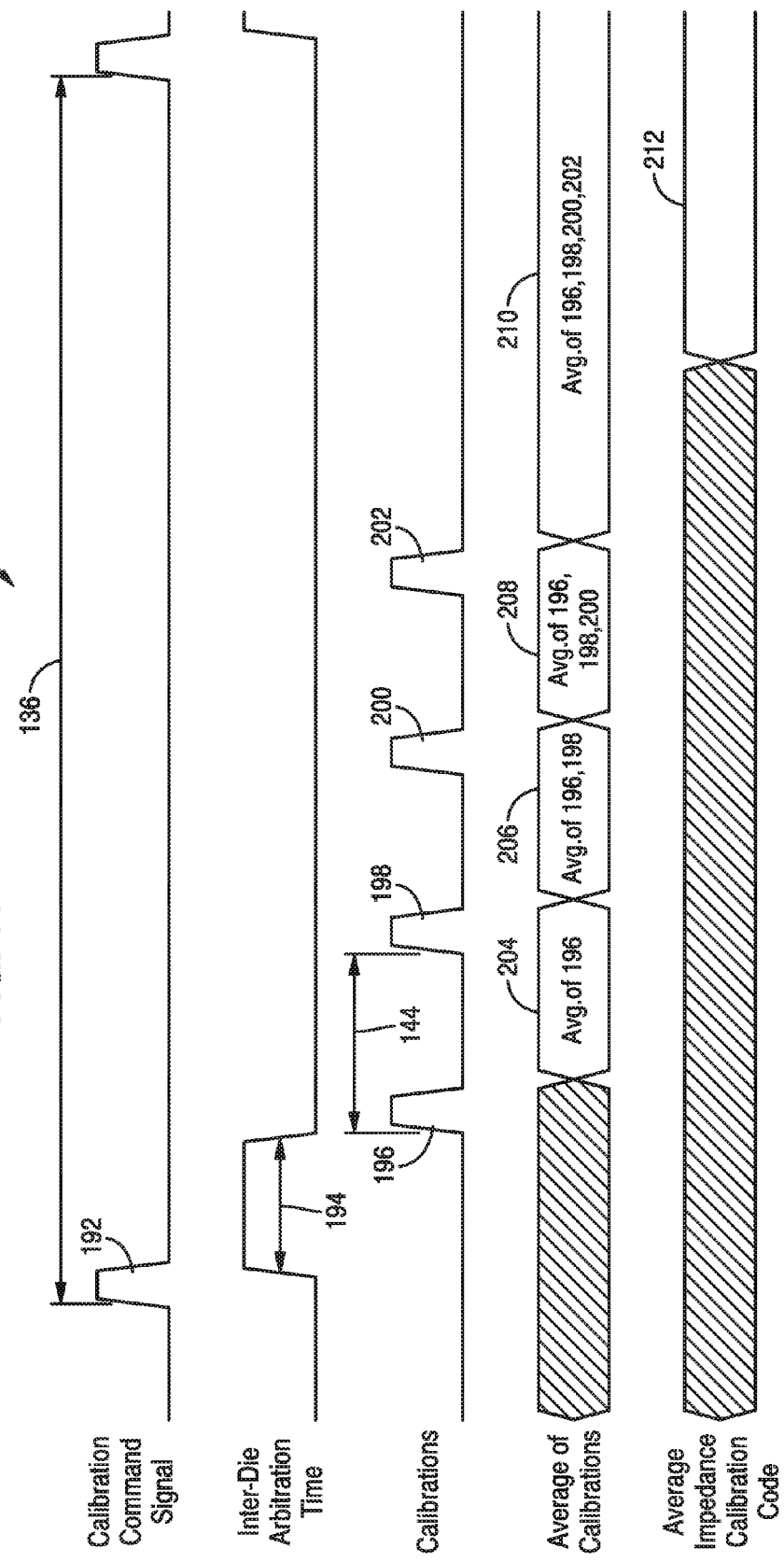
FIG. 11 is an example timing diagram for averaging multiple impedance calibrations to reduce calibration error caused by a DC (direct current) ripple in supply voltage, according to an embodiment of the present disclosure.

FIG. 11 is an example timing diagram 190 for averaging multiple impedance calibrations to reduce calibration error caused by a DC (direct current) ripple in supply voltage, according to an embodiment of the present disclosure. A calibration command signal 192 may indicate starting a calibration operation. For example, the calibration command signal 192 may include the calibration execution signal ZQEXE sent from the command decoder 46. When the calibration execution signal ZQEXE is transmitted, the code generator 42 may execute a calibration operation to generate the impedance calibration code (e.g., the adjustment code OUTCODE).

The calibration command signal 192 may have a period 136 of 30 to 150 ms (e.g., 32 ms). The calibration command signal 192 may be sent automatically by the semiconductor device 14 (e.g., as part of a background operation). As such, there may not be any related strict regulation regarding completion time of the calibration.

Calibration may be performed after an inter-die arbitration time 194. The inter-die arbitration time 194 may include a range of 1 to 100 us (microseconds) and be associated with, for example, how many other semiconductor devices 14 are attempting calibration at the same time.

After the inter-die arbitration time 194, the calibration circuit 110 may perform calibrations 196. As illustrated, four calibrations 196, 198, 200, 202 are performed with at a period 144 (e.g., that is a fraction of a period 142 of the supply voltage 132). For example, in response to receiving the calibration execution signal ZQEXE, the calibration control signal generation circuit 92 may send a calibration activation or control signal ZQACT for each calibration 196, 198, 200, 202. The calibration control signal generation circuit 92 may separate each calibration 196, 198, 200, 202 by the period 144 using timing circuitry, such as a timer. The period 144 of each calibration 196, 198, 200, 202 may include any suitable range of time, including 1 to 20 us (e.g., 5 us). Moreover, it should be understood that any suitable number of calibrations 196, 198, 200, 202 (e.g., two to 12 calibrations) may be performed. In some embodiments, the period 144 and/or the number of calibrations may be provided by a mode register (e.g., the mode register 80) of the semiconductor device 14. In one embodiment, a controller (e.g., the controller 12) may input the period 144 and/or the number of calibrations into the mode register 80. As such, the period 144 and/or the number of calibrations may be programmable.

The averaging circuit 111 may determine an average of the calibrations 196, 198, 200, 202. In some embodiments, to save die area, the averaging circuit 111 may average the calibrations 196, 198, 200, 202 as each calibration is generated and/or received. As such, after the calibration 196 is generated, an average 204 of the calibration 196 is determined. After the second calibration 198 is generated, an average 206 of the calibrations 196, 198 is determined. After the third calibration 200 is generated, an average 208 of the calibrations 196, 198, 200 is determined. And after the fourth calibration 202 is generated, an average 210 of the calibrations 196, 198, 200, 202 is determined. It should be noted that in additional or alternative embodiments, the average of the calibrations 196, 198, 200, 202 may be determined with any suitable technique, such as storing each calibration and averaging the calibrations once all calibrations have been stored.

An average impedance calibration code 212 may then be generated based on the average of the calibrations. As illustrated, the average impedance calibration code 212 is generated based on the average 210 of the calibrations 196, 198, 200, 202. The controller 12 may then calibrate the one or more programmable termination components based on the average impedance calibration code 212. For example, the relay circuit 44 may generate and send an adjustment code CODE based on the average impedance calibration code 212 to data output circuits 48, thereby adjusting output impedance of the data output circuits 48.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
   a power management integrated circuit configured to supply a periodic supply voltage signal;
   one or more programmable termination components;
   a calibration circuit configured to:
      generate a plurality of impedance calibration codes associated with a period of the periodic supply voltage signal; and
      calibrate impedance of the one or more programmable termination components based on an average impedance calibration code of the plurality of impedance calibration codes; and
   an averaging circuit configured to determine the average impedance calibration code of the plurality of impedance calibration codes.

2. The semiconductor device of claim 1, wherein the calibration circuit is configured to calibrate the impedance of the one or more programmable termination components based on each impedance calibration code of the plurality of impedance calibration codes.

3. The semiconductor device of claim 1, wherein the calibration circuit is configured to generate the plurality of impedance calibration codes within the period of the periodic supply voltage signal.

4. The semiconductor device of claim 1, wherein the one or more programmable termination components comprise a data output circuit of the semiconductor device.

5. A system comprising:
   a controller;
   a semiconductor device communicatively coupled to the controller, wherein the semiconductor device comprises:
      a power management integrated circuit configured to supply a periodic supply voltage signal;
      one or more programmable termination components;
      a calibration circuit configured to:
         generate a plurality of impedance calibration codes associated with a period of the periodic supply voltage signal in response to receiving a command signal from the controller; and
         calibrate impedance of the one or more programmable termination components based on an average impedance calibration code of the plurality of impedance calibration codes; and
      an averaging circuit configured to determine the average impedance calibration code of the plurality of impedance calibration codes.

6. The system of claim 5, wherein the calibration circuit comprises a comparator, a calibration terminal, and a counter, wherein the calibration circuit is configured to generate each impedance calibration code of the plurality of impedance calibration codes by incrementing or decrementing the impedance calibration code using the counter based on comparing a potential of the calibration terminal to a reference potential using the comparator.

7. The system of claim 6, wherein the counter is configured to increment the impedance calibration code when the potential of the calibration terminal is lower than the reference potential.

8. The system of claim 7, wherein the calibration circuit comprises a plurality of pull down units, wherein when the counter is configured to increment the impedance calibration code, impedance of the plurality of pull down units decreases, decreasing the potential of the calibration terminal.

9. The system of claim 8, wherein decreasing the potential of the calibration terminal results in the potential of the calibration terminal approaching or approximately matching the reference potential.

10. The system of claim 6, wherein the counter is configured to decrement the impedance calibration code when the potential of the calibration terminal is higher than the reference potential.

11. The system of claim 10, wherein the calibration circuit comprises a plurality of pull down units, wherein when the counter is configured to decrement the impedance calibration code, impedance of the plurality of pull down units increases, increasing the potential of the calibration terminal.

12. The system of claim 11, wherein increasing the potential of the calibration terminal results in the potential of the calibration terminal approaching or approximately matching the reference potential.

13. The system of claim 5, wherein the calibration circuit comprises a pull down unit, a pull up unit, a connection node that couples the pull down unit to the pull down unit, a comparator, and a counter, wherein the calibration circuit is configured to generate each impedance calibration code of the plurality of impedance calibration codes by incrementing or decrementing the impedance calibration code using the counter based on comparing a potential of the connection node to a reference potential using the comparator.

14. The system of claim 13, wherein the counter is configured to increment the impedance calibration code when the potential of the connection node is lower than the reference potential.

15. The system of claim 14, wherein the calibration circuit comprises a pull up unit, wherein when the counter is configured to increment the impedance calibration code, impedance of the pull up unit decreases, increasing the potential of the connection node.

16. The system of claim 15, wherein increasing the potential of the connection node results in the potential of the connection node approaching or approximately matching the reference potential.

17. The system of claim 13, wherein the counter is configured to decrement the impedance calibration code when the potential of the connection node is higher than the reference potential.

18. The system of claim 17, wherein the calibration circuit comprises a pull up unit, wherein when the counter decrements the impedance calibration code, impedance of the pull up unit increases, decreasing the potential of the connection node.

19. The system of claim 18, wherein decreasing the potential of the connection node results in the potential of the connection node approaching or approximately matching the reference potential.

20. A method, comprising:
receiving a period of a periodic supply voltage signal;
receiving a number of multiple impedance calibrations to perform and a period of the multiple impedance calibrations based on the period of the periodic supply voltage signal;
generating an impedance calibration code based on a voltage of the periodic supply voltage signal;
determining a sum of impedance calibration codes by summing the impedance calibration code with any previous impedance calibration codes;
determining an average impedance calibration code based on the sum of impedance calibration codes and the number of multiple impedance calibrations to perform; and
calibrating one or more programmable termination components based on the average impedance calibration code.

21. The method of claim 20, comprising calibrating the one or more programmable termination components based on the impedance calibration code to generate the number of multiple impedance calibrations.

22. The method of claim 20, wherein calibrating the one or more programmable termination components to generate the number of multiple impedance calibrations is performed within the period of the periodic supply voltage signal.

23. The method of claim 20, wherein determining the sum of impedance calibration codes comprises adding the impedance calibration code to a previous sum of impedance calibration codes.

24. The method of claim 20, wherein determining the average impedance calibration code comprises dividing the sum of impedance calibration codes by the number of multiple impedance calibrations to perform.

25. An apparatus comprising:
a voltage terminal supplied with a voltage fluctuating with a frequency;
a calibration circuit configured to produce a plurality of internal calibration commands (ZQACT) in sequence with intervals responsive to a calibration command (ZQEXE) and to generate a plurality of first calibration codes each produced responsive to a corresponding one of the plurality of internal calibration commands; and
an averaging circuit configured to produce a second calibration code comprising a value that is an average value of the plurality of first calibration codes.

26. The apparatus of claim 25, comprising a plurality of output drivers each configured to receive the second calibration code to calibrate an impedance thereof.

27. The apparatus of claim 25, wherein the plurality of first calibration codes, at least in part, comprises a third calibration code and a fourth calibration code produced following the third calibration code; and
wherein the averaging circuit is configured to produce a fifth calibration code comprising a value that is an average value of the third calibration code and the fourth calibration code.

28. The apparatus of claim 27, wherein the plurality of first calibration codes, at least in part, comprises a sixth calibration code produced following the fourth calibration code; and
wherein the averaging circuit is configured to produce a seventh calibration code comprising a value that is an average value of the third calibration code, the fourth calibration code and the sixth calibration code.

29. The apparatus of claim 25, wherein a length of each of the intervals is configured to be variable.

30. The apparatus of claim 25, wherein a number of the plurality of internal calibration commands is configured to be variable.

* * * * *